(12) United States Patent
Kramer et al.

(10) Patent No.: US 8,816,270 B2
(45) Date of Patent: Aug. 26, 2014

(54) OCTOPOLE DEVICE AND METHOD FOR SPOT SIZE IMPROVEMENT

(71) Applicants: Aleksandra Kramer, Munich (DE); Stefan Lanio, Erding (DE)

(72) Inventors: Aleksandra Kramer, Munich (DE); Stefan Lanio, Erding (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 178 days.

(21) Appl. No.: 13/663,692

(22) Filed: Oct. 30, 2012

(65) Prior Publication Data

US 2014/0103201 A1   Apr. 17, 2014

(30) Foreign Application Priority Data

Oct. 16, 2012   (EP) ..................................... 12188686

(51) Int. Cl.
*G01D 18/00*   (2006.01)
*G21K 1/093*   (2006.01)

(52) U.S. Cl.
CPC ...................................... *G21K 1/093* (2013.01)
USPC ...................................................... 250/252.1

(58) Field of Classification Search
CPC ...................................................... G21K 1/093
USPC ....................................................... 250/252.1
See application file for complete search history.

(56) References Cited

U.S. PATENT DOCUMENTS

| | | |
|---|---|---|
| 6,646,267 B1 | 11/2003 | Haider et al. |
| 6,784,437 B2 | 8/2004 | Rose |
| 7,807,965 B2 | 10/2010 | Zach et al. |

FOREIGN PATENT DOCUMENTS

| | | | |
|---|---|---|---|
| EP | 0500179 | 8/1992 | |
| EP | 1335402 | 8/2003 | |
| EP | 1432006 | 6/2004 | |
| JP | 08017702 A | * 1/1996 | ............ H01L 21/027 |

OTHER PUBLICATIONS

Scherzer, "Sparische and chromatische Korrektur von Elektronen-Linsen", OPTIK, JENA, DE Jan. 1, 1947, pp. 114-132.
European Search Report dated Feb. 2, 2013 for European Patent Application No. 12188686.5. (17437EP).

* cited by examiner

*Primary Examiner* — Kiho Kim
(74) *Attorney, Agent, or Firm* — Patterson & Sheridan, LLP

(57) ABSTRACT

A method of compensating mechanical, magnetic and/or electrostatic inaccuracies in a scanning charged particle beam device is described. The method includes an alignment procedure, wherein the following steps are conducted: compensating 4-fold astigmatism with an element having at least 8-pole compensation capability, wherein the aligning and compensating steps of the alignment procedure act on a charged particle beam with beam dimensions in two orthogonal directions each of at least 50 μm and coaxially aligned with at least the element having at least the 8-pole compensation capability.

15 Claims, 7 Drawing Sheets

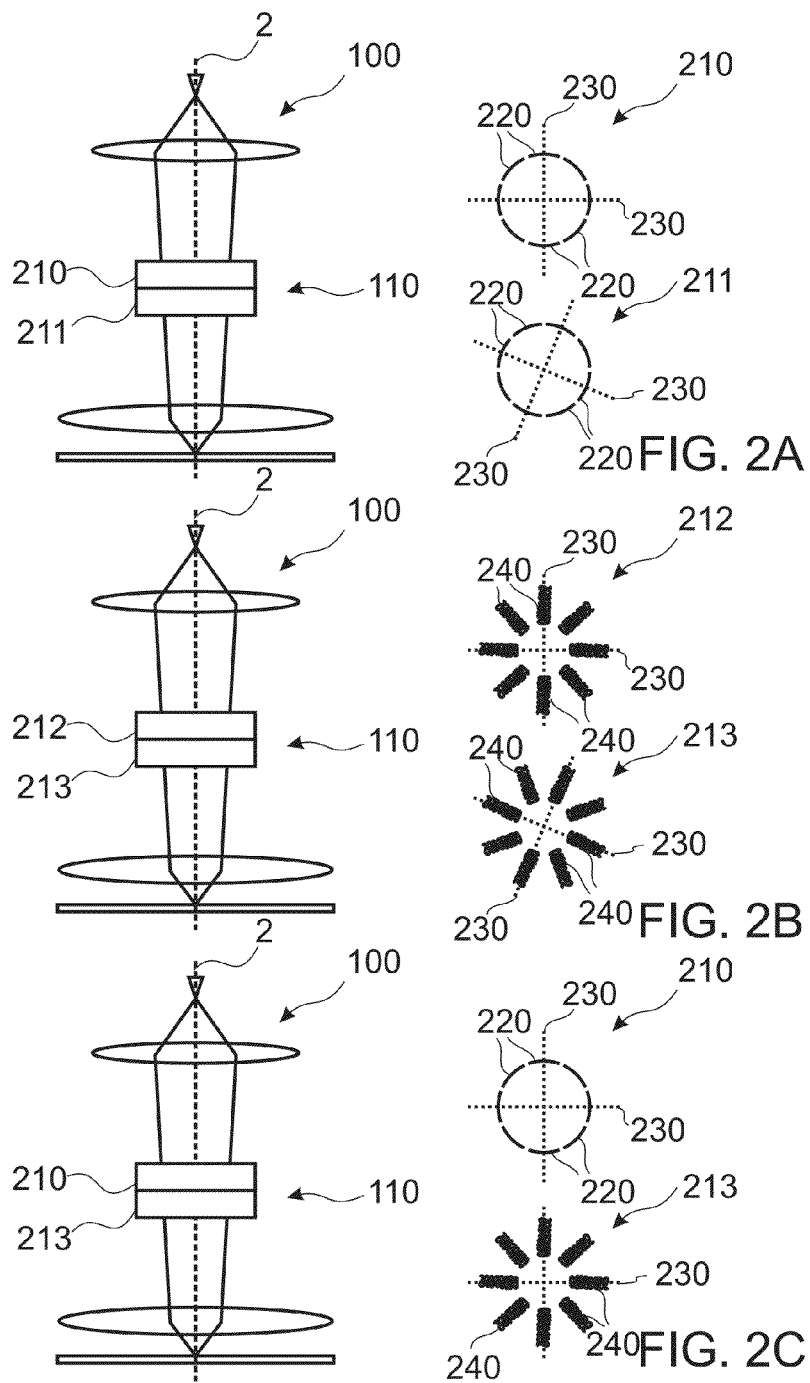

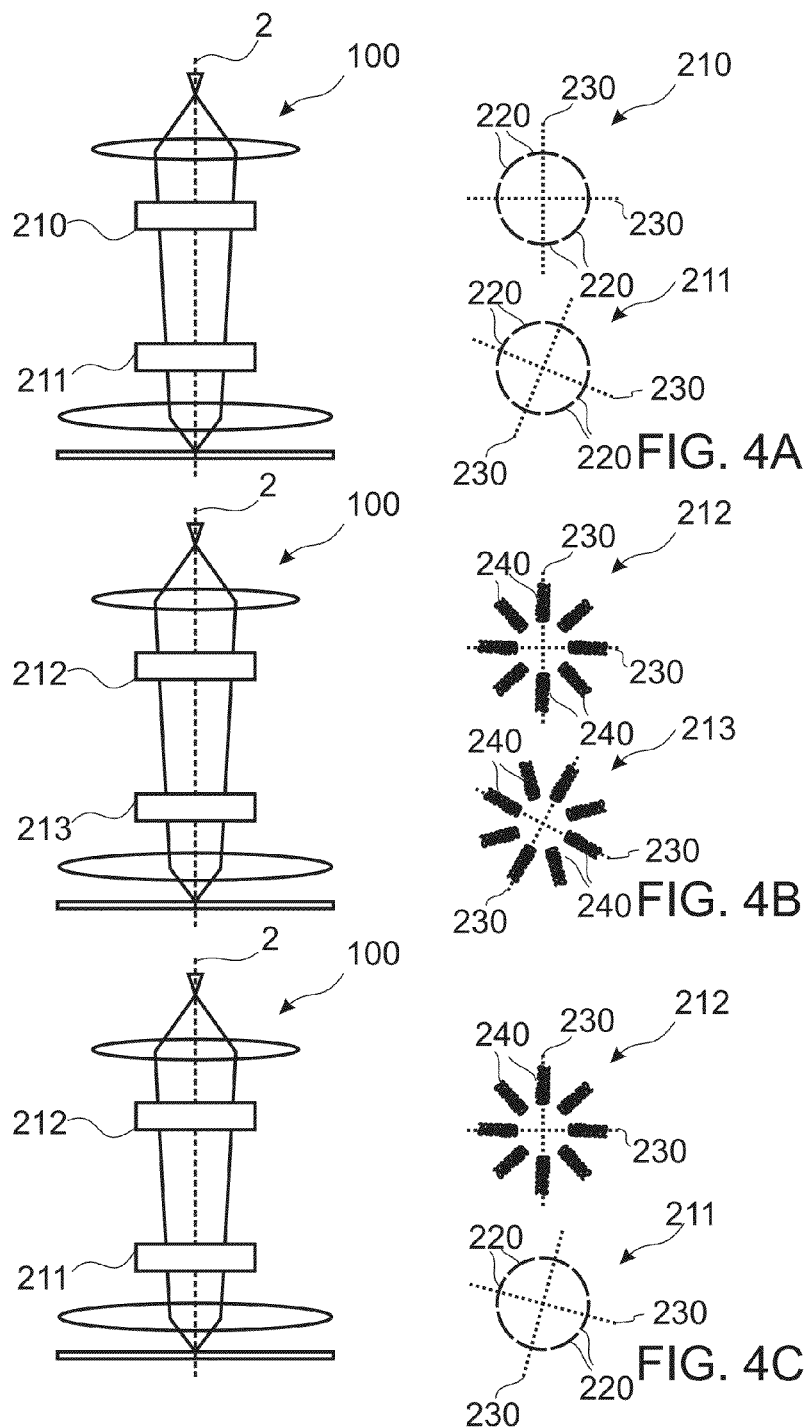

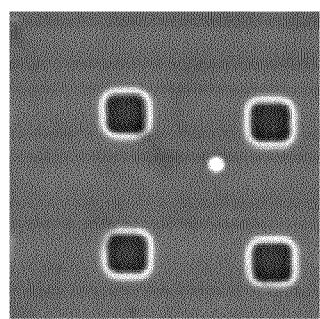
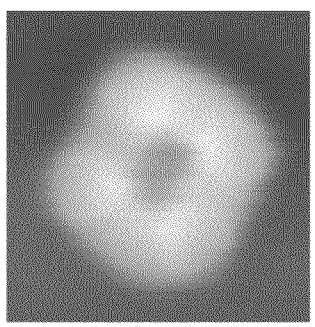
FIG. 6A  FIG. 6B
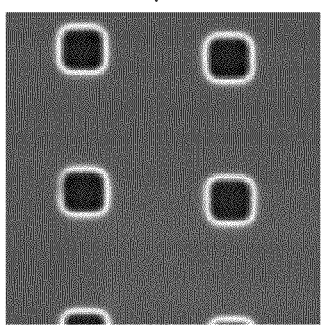
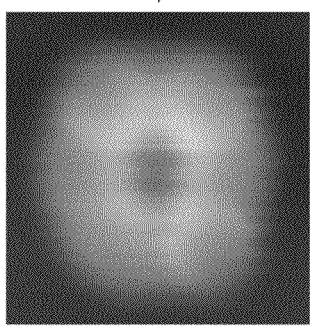

OCTOPOLE DEVICE AND METHOD FOR SPOT SIZE IMPROVEMENT

TECHNICAL FIELD OF THE INVENTION

Embodiments of the invention relate to charged particle beam devices, for example, for inspection system applications, testing system applications, lithography system applications, defect review or critical dimensioning applications or the like, and particularly to electron beam inspection devices. It also relates to methods of operation thereof. Further, embodiments of the invention relate to compensation of inaccuracies in scanning charged particle beam devices comprising a corresponding compensation assembly, particularly for electron beam inspection systems. Specifically, embodiment of the invention relates to methods of compensating mechanical, magnetic and/or electrostatic inaccuracies in a scanning charged particle beam device and scanning charged particle beam devices.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g., electron beams, which are generated and focused in charged particle beam devices, such as electron microscopes or electron beam pattern generators. Charged particle beams offer superior spatial resolution compared to, e.g. photon beams due to their short wavelengths.

Particle beam optical systems suffer from various types of imperfections, e.g. mechanical manufacturing imperfections, misalignment of optical components, material inhomogenities, imperfections of the electric and magnetic fields used for focusing, aligning and adjusting, electron optical aberrations, contaminations and charging of beam steering components. A good electron optical design aims at minimizing these imperfections by imposing strict tolerances on mechanical manufacturing, material properties and cleanliness and by optimizing the electron optical performance through proper design.

However, with these measures alone the theoretical optical performance will not be obtainable. Therefore, a lot of devices and methods have been devised over the years which allow counteracting the influence of the above mentioned imperfections. Such devices can be, amongst others, dipole deflectors (to correct misalignment between components), quadrupole stigmators (to correct axial astigmatism in the image), heated sample holders and apertures (to avoid contamination and/or subsequent charging), in-situ plasma cleaning (to remove contaminations in the beam line), and the like.

The above mentioned imperfections become more noticeable if resolution improves so that the spot deterioration becomes clearly visible, the beam leaves the paraxial region around the optical axis and experiences higher order aberrations, the beam current is increased, and/or the beam bundle diameter is increased, in order to reduce electron-electron interaction. This makes the beam more sensitive to higher order aberrations that deteriorate the diameter of the focused spot. Further, the above mentioned imperfections become more noticeable if the beam current in the system increases since this also increases the rate of contamination build-up that causes beam instabilities and spot size deterioration.

These critical conditions are all fulfilled in modern electron beam inspection (EBI) columns. Accordingly, it is desirable to provide a device that compensates such influences that limit the performance of the high beam current system. This will improve resolution and make the system less sensitive to mechanical imperfections, contamination and contamination build-up over time since it provides a remedial measure. This would further assist in improving system performance and/or throughput, extending service intervals and lowering of cost of ownership.

SUMMARY OF THE INVENTION

In light of the above, a method of compensating mechanical, magnetic and/or electrostatic inaccuracies in a scanning charged particle beam device and a scanning charged particle beam device as claimed are provided. Further aspects, advantages, and features of the present invention are apparent from the dependent claims, the description, and the accompanying drawings.

According to one embodiment, a method of compensating mechanical, magnetic and/or electrostatic inaccuracies in a scanning charged particle beam device is provided. The method includes an alignment procedure, wherein the following steps are conducted: compensating 4-fold astigmatism with an element having at least 8-pole compensation capability, wherein the aligning and compensating steps of the alignment procedure act on the charged particle beam with beam dimensions in two orthogonal directions each of at least 50 μm and coaxially aligned with at least the element having at least the 8-pole compensation capability.

According to another embodiment, a scanning charged particle beam device is provided. The device includes an emitter with at least one emitter tip, one lens assembly configured for focusing the emitter tip on a specimen, the focusing assembly consists of a condenser lens assembly and an objective lens, wherein the condenser lens assembly and the objective lens are rotationally symmetric. The device further includes a compensation assembly for compensating mechanical, magnetic or electrostatic inaccuracies, wherein the compensation assembly comprises at least one element selected from the group consisting of: a first octopole element and a second octopole element acting in respective different directions, a rotatable octopole element; and an element being at least a 12-pole element.

According to a further embodiment, a method of compensating mechanical, magnetic and/or electrostatic inaccuracies in a scanning charged particle beam device is provided. The method includes an alignment procedure, wherein the following steps are conducted in the below order: aligning a charged particle beam to be scanned over a specimen to an optical axis, compensating axial astigmatism with an element having at least 4-pole compensation capability, compensating 3-fold astigmatism with an element having at least 6-pole compensation capability, and compensating 4-fold astigmatism with an element having at least 8-pole compensation capability, wherein the aligning and compensating steps of the alignment procedure act on an the charged particle beam with beam dimensions in two orthogonal directions each of at least 50 μm and coaxially aligned with at least the element having at least the 8-pole compensation capability.

According to a yet further embodiment, a scanning charged particle beam device is provided. The device includes an emitter with at least one emitter tip, one lens assembly configured for focusing the emitter tip on a specimen, the focusing assembly consists of a condenser lens and an objective lens, a compensation assembly for compensating mechanical, magnetic or electrostatic inaccuracies, wherein the compensation assembly comprises at least one element selected from the group consisting of: a first octopole element and a second octopole element acting in respective different directions, a rotatable octopole element; and an element being at least a 12-pole element.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIGS. 2A to 2C show schematically charged particle beam devices with a compensation assembly having two octopole elements in one plane and being adapted for compensating a four-fold astigmatism and having at least an eight-pole compensation capability according to embodiments described herein;

FIGS. 4A to 4C show schematically charged particle beam devices with a compensation assembly having two octopole elements in two plane and being adapted for compensating a four-fold astigmatism and having at least an eight-pole compensation capability according to embodiments described herein;

FIGS. 6A and 6B illustrate sample images for showing the improvements obtained with embodiments described herein.

DETAILED DESCRIPTION OF EMBODIMENTS

Figure 1:
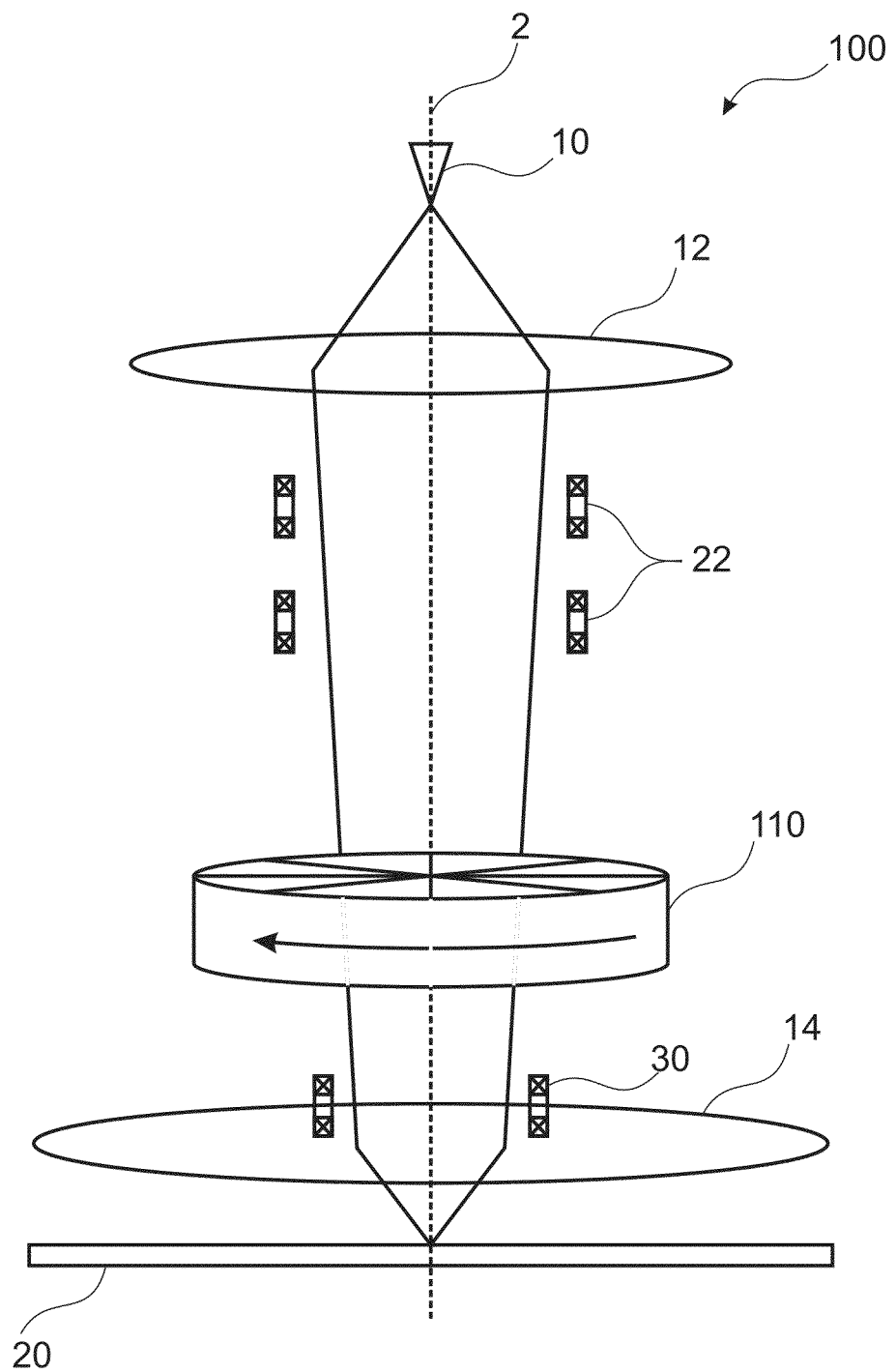
FIG. 1 shows schematically a charged particle beam device with a compensation assembly adapted for compensating a four-fold astigmatism and having at least an eight-pole compensation capability according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. Embodiments of the present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications Generally, when referring to focusing a charged particle beam, it is understood that the beam of charged particles is reduced in divergence. This means, the charged particles of a beam are focused or at least collimated towards a subsequent beam optical element to decrease losses of charged particles due to divergence or due to blocking of charged particles. Correspondingly, defocusing is understood as increasing the divergence. Further, it is understood that in the literature of the technical field the term "octople" and "octupole" are used similarly; where herein reference is made to "octopole" this can be replaced by "octupole" and vice versa.

Embodiments of the invention relate to an octopole compensation element for particle beam systems, e.g. for electron microscopes for electron beam inspection (EBI), for defect review or critical dimension measurement, for focused ion beam systems etc. These embodiments described herein are particularly, but not only, useful for the correction of electron beams with large numerical aperture, large beam diameter and/or large beam current in scanning electron microscopes, such as for EBI. However, other types of charged particle beams could also be corrected by the device.

Particularly for such above-described applications, a standard quadrupole stigmator may not sufficient to control the spot size of the focused beam and obtain the best resolution. Because of a large beam diameter throughout the column, e.g. in a range of at least 50 µm to 500 µm with the exception of the focus on the specimen, some embodiments include an alignment scheme that allows to simultaneously center the beam to the magnetic and electric centers of the objective lens which are displaced against each other along the optical axis (split align), a pair of orthogonal hexapole elements to compensate 2nd order axial aberrations, a method for compensating coma caused by alignment imperfections (Schleier correction), and further allows to correct for the next order of aberrations, i.e.

compensating 4-fold astigmatism with an element having at least 8-pole compensation capability.

FIG. 1 shows a scanning charged particle beam device 100. The charged particle beam device includes an emitter 10 for emitting a charged particle beam, for example an electron beam, along an optical axis 2. The emitter has an emitter tip, which is focused on a specimen 20 with a lens assembly. According to embodiments described herein, which can be combined with other embodiments described herein, the lens assembly consists of a condenser lens 12 and an objective lens 14. According to typical modifications, the condenser lens can also be replaced by a condenser lens assembly having one, two or three condenser lenses. Thereby, a lens assembly with rotational symmetric lenses is utilized to focus that charged particle beam on the specimen 20.

According to typical embodiments, as shown in FIG. 1, alignment deflectors 22 are provided in the charged particle beam device. Thereby, it is to be understood that even though the alignment deflectors 22, which are exemplarily shown as a double stage alignment deflection system in FIG. 1, are shown in one direction, alignment deflectors can also be provided in a second direction, e.g. perpendicular to the paper plane in FIG. 1.

According to embodiments described herein, which can be combined with other embodiments, a scanning deflector 30 is provided for scanning the charged particle beam over the specimen 20.

According to typical modifications of herein-described embodiments, alignment deflectors and/or scanning deflectors can be magnetic (as shown in FIG. 1), electrostatic or combined electrostatic-magnetic.

The charged particle beam device 100 further includes a compensation assembly for compensating mechanical, magnetic and/or electrostatic inaccuracies in the device. In FIG. 1, the compensation assembly 110 is shown as a rotatable octopole element. According to typical embodiments, the compensation assembly is adapted for compensating a four-fold astigmatism and has at least an eight-pole compensation capability. For example, a first octopole element and a second octopole element acting in respective different directions, a rotatable octopole element, and an element having at least 12 poles, for example 16 poles, can be provided.

Within the context of the present disclosure it is distinguished between compensation of inaccuracies, for example mechanical, magnetic and/or electrostatic inaccuracies, and corrections of aberrations. For correction of aberrations, the coefficients Cs and Cc, which describe deviations of linear optics, i.e. spherical aberration and chromatic aberration are compensated. It has been shown by Otto Scherzer in 1940 that the two coefficients Cs and Cc are always positive and not equal to zero for rotational symmetric, time independent, and space charge free lenses. Embodiments described herein relate to systems, such as EBI columns, which fulfill all three conditions. This is one existing difference as compared to systems including aberration correction. These systems include fields deviating from the rotation symmetry, such as quadrupole lenses, and/or astigmatic intermediate images are generated. Thereby, it should be noted that systems relating to Cs and Cc correction include astigmatic intermediate images, even though that might not be explicitly mentioned in many publications. For embodiments described herein, the compensation assembly acts on an essentially round beam and is positioned and adapted to act on an essentially round beam. This is different as compared to systems having higher order elements for compensating spherical and/or chromatic aberrations.

The common principle of the compensations described herein and the correction of spherical and chromatic aberrations is the utilization of higher order multipoles. For aberration correction, predetermined corrective contributions to the coefficients Cs and Cc are generated to compensate these coefficients. For the compensation of inaccuracies according to embodiments described herein, deviations in the focusing properties, which do not exist in the above described theory in light of the rotational symmetry, and which continue to exist after correction of the coefficients Cs and Cc has been carried out. Such inaccuracies can be mechanical manufacturing imperfections, misalignment of optical components, material inhomogenities, imperfections of the electric and magnetic fields used for focusing, aligning and adjusting, contaminations and charging of beam steering components, etc. These inaccuracies result in loss of perfect rotational symmetry. Accordingly, rotational lenses and fields are typically referred to as essentially rotational symmetric within the present disclosure. The resulting field distortions can be described by a multipole expansion, and the multipole components can be beneficially corrected as described herein.

Thereby, a deflection of the beam can be corrected with a dipole, for example the deflector 22 as shown in FIG. 1, and as known in the art. An axial astigmatism can be corrected with a quadrupole, for example a stigmators, and as also known in the art. According to embodiments described herein, which can be combined with other embodiments described herein, a three-fold astigmatism can be corrected with a hexapole, for example with a hexapole-stigmator. And a four-fold astigmatism can be corrected with an octopole, for example an octopole-stigmator.

A further difference as compared to correction of spherical and chromatic aberration is the beneficial utilization of the embodiments described herein in electron beam inspection systems. Aberration correction aims at increase of the numerical aperture in order to improve resolution of the system. Thereby, the depth of focus is reduced. Electron beam inspection systems, i.e., EBI systems, already use, according to embodiments described herein, a numerical aperture in a range of 10 to 70 mrad. This is due to the fact that beam currents in a range of 10 to 500 nA are provided such that electron-electron-interaction has a sufficiently large contribution to the beam diameter, i.e. the resolution. Thus, numerical apertures are already increased to the above-mentioned range for best performance. Thereby, according to typical embodiments, which can be combined with other embodiments described herein, the depth of focus is in a range of 0.1 to 1 μm. A further decrease of the depth of focus would jeopardize electron beam inspection, which is typically conducted on-the-fly, wherein deviations from a flat wafer surface cannot be corrected for at that desired inspection speeds and, thus, need to be within the depth of focus. Accordingly, the methods according to typical embodiments described herein and that apparatuses according to typical embodiments described herein, can be beneficially utilized for numerical apertures, beam currents, and depths of focus in the above-mentioned ranges.

In order to correct the next level of spot aberrations, namely the 3rd order four-fold geometrical aberrations, a compensating octopole field of adjustable strength and orientation is provided for embodiments described herein. The octopole device according to the invention is located at a position of sufficient beam diameter with an essentially round beam and co-axially with the beam axis (otherwise it will generate defocus, beam deflection, and 1st & 2nd order astigmatism).

According to typical embodiments, the beam diameter at the position of the compensation assembly is in a range of 50 to 500 μm.

The two orthogonal octopole fields can be either magnetic or electrostatic or both. Possible configurations are described with respect to FIGS. 1, and 2A to 4C.

As described above, FIG. 1 shows the compensation assembly 110 which is axially aligned with the beam axis 2 and which is located at a position with a sufficient diameter of the charged particle beam. The compensation assembly 110 as shown in FIG. 1 is a magnetic or electrostatic octopole, which can be rotated around its axis and/or the optical axis 2, respectively.

Further embodiments, which can be combined with other embodiments described herein, are illustrated in FIGS. 2A to 2C. In FIG. 2A, the compensation assembly is provided by two octopoles 210 and 211 which are provided at a single position along the axis 2 and within two planes such that the fields of the first octopole 210 and the second octopole 211 overlap essentially. For example, the position along the axis 2 of one octopole is in the area where the strength of the electrostatic field of the other octopole element, or in FIGS. 2B and 2C the electrostatic and/or magnetic field, is 50% or more of the maximum field strengths.

In the embodiment shown in FIG. 2A, two electrostatic octopoles 210 and 211 are provided. Each of the electrostatic octopoles includes eight electrodes 220, which are configured to be individually biased. As can be seen by the axes 230, the second octopole 211 is rotated with respect to the first octopole 210 by an angle such as 22.5°.

In the embodiment shown in FIG. 2B, two magnetic octopoles 212 and 213 are provided similarly to the octopoles 210 and 211 in FIG. 2A. Each of the octopoles 212 and 213 includes eight coils 240. The octopoles are rotated with respect to each other by an angle such as 22.5°, as illustrated by axes 230.

FIG. 2C shows a combined electrostatic magnetic compensation assembly 110, wherein an electrostatic octopole 210 is combined with a magnetic octopole 213. Both octopoles are provided at the single position within two planes along the axis 2. The octopole 210 includes eight electrodes 220. The octopole 213 includes eight coils 240. In light of the fact that the electrostatic field and the magnetic field are orthogonal to each other in an electro-magnetic sense, the two octopoles are not rotated with respect to each other. According to a yet further embodiment, the magnetic octopole 213 can also be provided in the plane above the electrostatic octopole 210, i.e. the two octopoles in FIG. 2C switch their position.

Figure 3A:
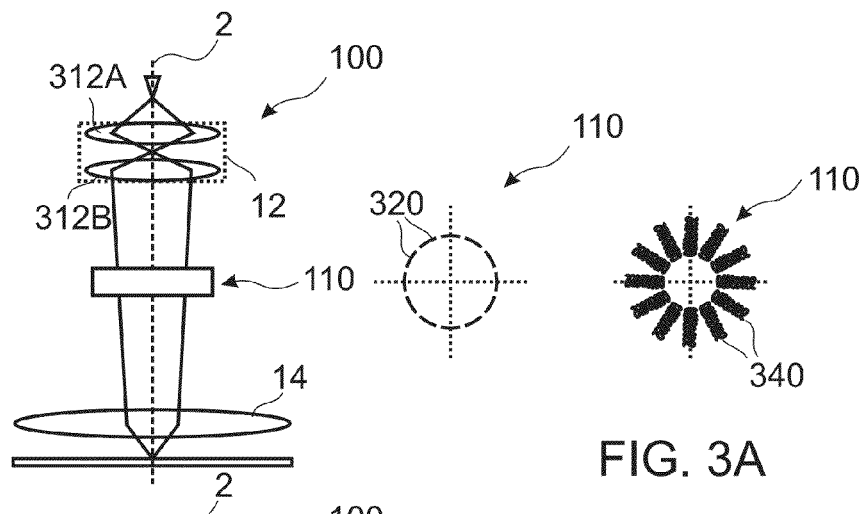
FIGS. 3A to 3C show schematically charged particle beam devices with a compensation assembly having one octopole element adapted for compensating a four-fold astigmatism and having at least an eight-pole compensation capability according to embodiments described herein.
Figure 3B:
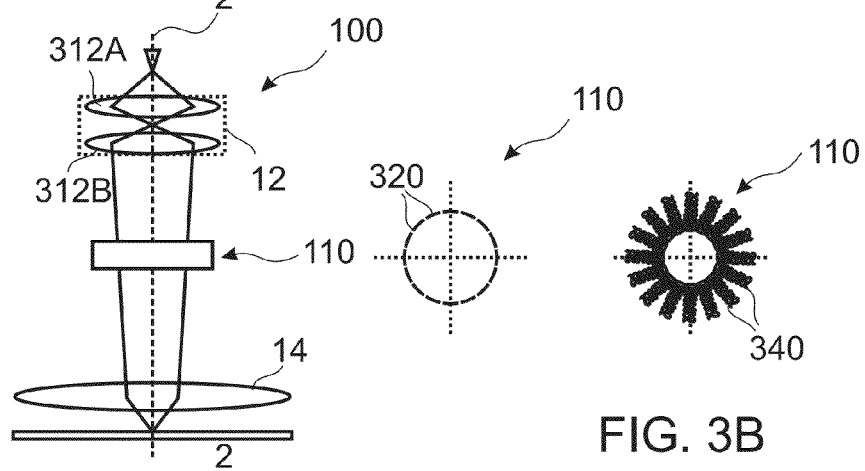
Figure 3C:
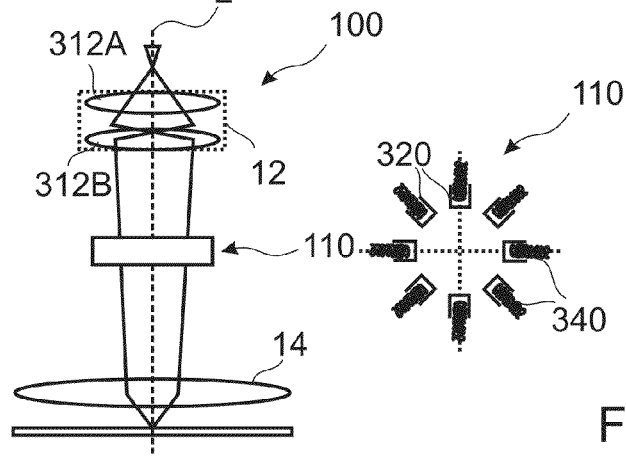

FIGS. 3A to 3C show further embodiments of scanning charged particle beam devices 100. According to some embodiments, which can be combined with other embodiments described herein, the charged particle beam device can include a condenser lens assembly 12 having more than one condenser lens. The examples shown in FIGS. 3A to 3C have a first condenser lens 312A and a second condenser lens 312B. Accordingly, typical modifications of embodiments described herein may have more than one condenser lens. Thereby, however, the lens assembly consists of condenser lens or a condenser lens assembly and of an objective lens. As shown in FIGS. 3A to 3C a cross-over of the charged particle beam can be generated in the condenser lens assembly 12, typically between a first condenser lens 312A and a further condenser lens, e.g. the second condenser lens 312B. All lenses in the lens assembly for focusing the charged particle beam on the specimen are rotational symmetric. Accordingly, no astigmatic images are generated in the beam path from the emitter to the specimen. According to some typical modifications of embodiments described herein, the lens assembly is configured for, and operated such that no cross over is generated from the emitter to the specimen. For example the lens system results in an essentially telecentric beam path.

According to typical embodiments described herein, the charged particle beam devices and methods of operating thereof do not include astigmatic lenses. Thus, in the event of the cross-over referred to with respect to FIGS. 3A to 3C above, an astigmatism might result in line foci, which are directly adjacent to each other, i.e. within 1 mm or less, typically within a few 100 μm or less. However, the charged particle beam devices and methods of operating thereof do not include astigmatic lenses configured, adapted, positioned in a column and/or operated such that line foci having a macroscopic distance of, for example, 10 mm or above, such as 30 to 80 mm are generated, i.e. intentionally generated.

The compensation assemblies 110 shown in FIGS. 3A to 3C are provided at a single position and in one plane. FIG. 3A illustrates embodiments where the compensation assembly 110 includes 12 electrodes 320. Alternatively, the compensation assembly 110 can include 12 coils 340. FIG. 3B illustrates embodiments where the compensation assembly 110 includes 16 electrodes 320. Alternatively, the compensation assembly 110 can include 16, 340. FIG. 3C illustrates embodiments where the compensation assembly 110 includes eight electrodes 320 in combination with eight coils 340. For example, the coils can be wound on pole pieces, which act as electrodes. Thereby, it has to be considered that due to the orthogonal behavior of the electrostatic field and the magnetic field, the electrodes and coils can be provided at the same rotational position in order to provide 16 poles capable of generating an octopole field that can be controlled in strength and orientation. The 12 poles or 16 poles, respectively, as shown in FIGS. 3A to 3C can generally be controlled such that an octopole field can be generated, which is variable in field strength and orientation, i.e. rotational orientation around axis 2 of the scanning charged particle beam device 100. Accordingly, according to embodiments described herein, a compensating octopole field of adjustable strength and orientation is provided at a position, which is co-axially with the lens assembly and at a position with a sufficiently large beam diameter of an essentially round beam in order to correct for deviations from a perfect rotational symmetry.

According to yet further embodiments, as illustrated in FIGS. 4A to 4C, two orthogonal octopole fields can be either magnetic or electrostatic or both and can be provided at two positions and in two separate planes.

In FIG. 4A, the compensation assembly is provided by two octopoles 210 and 211 which are provided at two positions along the axis 2 and within two planes such that the fields of the first octopole 210 and the second octopole 211 do not overlap essentially, for example, such that the position along the axis 2 of one octopole is in the area where the strength of the electrostatic field of the other octopole element, or in FIGS. 4B and 4C the electrostatic and/or magnetic field, is 20% or less of the maximum field strengths.

In the embodiment shown in FIG. 4A, two electrostatic octopoles 210 and 211 are provided. Each of the electrostatic octopoles includes eight electrodes 220, which are configured to be individually biased. As can be seen by the axes 230, the second octopole 211 is rotated with respect to the first octopole 210 by an angle, which is provided by 22.5° plus the angle of a lamor rotation of the beam in the system.

In the embodiment shown in FIG. 4B, two magnetic octopoles 212 and 213 are provided similarly to the octopoles 210 and 211 in FIG. 4A. Each of the octopoles 212 and 213 includes eight coils 240. The octopoles are rotated with respect to each other by an angle, which is provided by 22.5° plus the angle of a lamor rotation of the beam in the system.

FIG. 4C shows a combined electrostatic magnetic compensation assembly 110, wherein an electrostatic octopole 211 is combined with that magnetic octopole 212. Both octopoles are provided at the two positions within two planes along the axis 2. The octopole 211 includes eight electrodes 220. The octopole 212 includes eight coils 240. In light of the fact that the electrostatic field and the magnetic field are orthogonal to each other in an electro-magnetic sense, the two octopoles are only rotated by an angle corresponding to the lamor rotation of the beam. According to yet further embodiments, the magnetic octopole 212 can also be provided in the plane below the electrostatic octopole 211, i.e. the two octopoles in FIG. 4C switch their position.

Accordingly, for purely magnetic or purely electrostatic octopoles, the fields can be generated by a single element providing both octopole directions or two separated elements—in essentially one plane or in two planes separated along the optical axis—one for each direction. Thereby, a possibly existing Larmor rotation between the locations of the two elements must be taken into account to ensure orthogonality.

If two elements are used, they both have at least 8 electrodes or pole pieces. If a single element is used, it includes more than 8 pole pieces. With 16 pole pieces the orthogonal fields can be generated independently, but a lower number of poles (e.g. 12) is also sufficient if the excitation of the poles is properly adjusted.

It is also possible to combine a magnetic element for the first direction with an electrostatic element for the second direction. This can be done using separated elements. An especially beneficial design, as shown in FIG. 3C, uses 8 pole pieces that are used as magnetic and electric poles simultaneously, because the two fields automatically generate orthogonal forces.

Figures 5A, 5B:
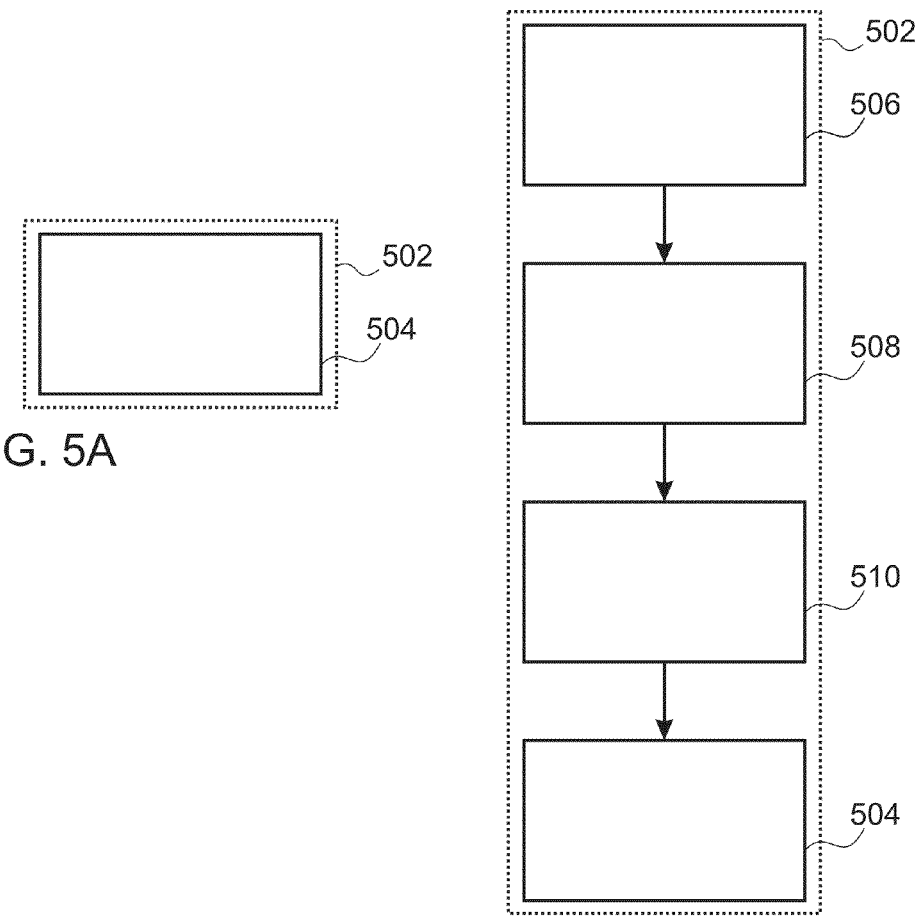
FIGS. 5A and 5B show flow charts for illustrating embodiments of methods for compensating mechanical, magnetic and/or electrostatic inaccuracies in a scanning charged particle beam device.

According to yet further embodiments, which can be combined with other embodiments described herein, the compensation assembly can also be used to generate one, more, or all lower order correction fields (defocus, deflection, 1st & 2nd order astigmatism). Therefore the compensation assembly as described herein can replace some of the other compensation components in a column. Particularly for electrostatic octopole elements, lower order correction fields might be additionally generated by the octopole. In this case, other elements, preferably all other elements, in the corrections assembly can be emitted. Utilizing an electrostatic octopole, all desired multi-poles can be generated concentric on a desired optical axis, such that iterative alignment procedures might not be necessary. For deviating axes of the different orders of correction, an iterative alignment procedure is beneficial because, e.g., a 2nd order astigmatism compensation might necessitate a further correction of the deflection FIG. 5A shows a flow chart illustrating embodiments for methods of compensating mechanical, magnetic and/or electrostatic inaccuracies in a scanning charged particle beam device. In step 502 an alignment procedure is conducted, wherein the alignment procedure includes compensating 4-fold astigmatism with an element having at least 8-pole compensation capability, wherein the aligning and compensating steps of the alignment procedure act on an the charged particle beam with beam dimensions in two orthogonal directions each of at least 50 μm and coaxially aligned with at least the element having at least the 8-pole compensation capability.

According to typical modifications thereof, the alignment procedure can include, as shown in FIG. 5B, and wherein the steps are provided in this order: aligning a charged particle beam to be scanned over a specimen to an optical axis as indicated by step 506, compensating axial astigmatism with an element having at least 4-pole compensation capability as indicated by step 508, compensating 3-fold astigmatism with an element having at least 6-pole compensation capability as indicated by step 510, and compensating 4-fold astigmatism with an element having at least 8-pole compensation capability as indicated by step 504, wherein the aligning and compensating steps of the alignment procedure act on an the charged particle beam with beam dimensions in two orthogonal directions each of at least 50 μm and coaxially aligned with at least the element having at least the 8-pole compensation capability. According to a yet further implementations, the alignment procedure can further include fine focusing of the charged particle beam on the specimen after aligning the charged particle beam and before compensating the axial astigmatism. Providing the alignment step in this order allows for higher order compensation, because the higher order influences of the inaccuracies are typically not visible as long as a lower order influence of the inaccuracies are not compensated for.

As describe above with respect to FIGS. 2A to 4C, embodiments of scanning charged particle beam devices and of method of compensating inaccuracies provide a compensation assembly and/or a compensation procedure, wherein the 8-pole compensation capability is provided by an octopole field, which is adjustable in azimuth angle and field strength. Thereby, it has to be clearly distinguished between the herein-described compensation and correction of spherical and chromatic aberrations, which is different in the compensation method and the positioning of the compensation assembly in the column, i.e. the scanning charged particle beam device. Typically, for embodiments described herein, the alignment procedure does not include a correction of spherical aberration and/or chromatic aberration and a compensation of aberration coefficients Cs and/or Cc.

The influence of the embodiments described herein is illustrated in FIGS. 6A and 6B. FIG. 6A each show a comparison of image quality using state-of-the-art beam alignment including split align, quadrupole & hexapole stigmation and coma correction. FIG. 6A shows in the upper figure, with a state of the art alignment an asymmetry of the spot, which is e.g. in this case is caused by aperture contamination. Using additional octopole correction as shown in FIG. 6A in the lower part, the asymmetry can be removed. FIG. 6B is a close-up of a small particle in under focus condition. Instead of being uniformly blurred, the particle appears as a squarish ring with four pronounced intensity maxima around a darker center. This is caused by the fourfold astigmatism. Using octopole correction as shown in the lower part of FIG. 6B, the defocused image of the particle appears much rounder, the asymmetry is reduced and the intensity in the bright ring is more uniformly distributed, showing 6 instead of 4 maxima. These are caused by non-corrected 5th order influences of the inaccuracies. The result of a corresponding spot size measurement indicates a 5% improvement of the corrected spot size as compared to a spot size having uncorrected 4-fold aberrations.

Embodiments described herein, particularly when being utilized in or as an electron beam inspection system (EBI), which is considered a common term in the respective technical field, provide a high current electron beam probe with a simple optics, e.g. without Cc and Cs correction. For optimum conditions for spot size/resolution at a given beam current and given aberration coefficients Cc and Cs, i.e. at a given numerical aperture under these conditions, the beam is intended to be fully rotational symmetric in the column in order to provide optimized focus of a round electron probe on the specimen. Imperfections, e.g. mechanical manufacturing imperfections, misalignment of optical components, material inhomogenities, imperfections of the electric and magnetic fields used for focusing, aligning and adjusting, electron optical aberrations, contaminations and charging of beam steering components, and/or combinations thereof, particularly of fixedly installed components, deteriorate the rotational symmetry. Some of these imperfections can be time independent, whereas contaminations can be time dependent, i.e. build up during operation of the device. Particularly for high beam current, e.g., EBI systems, charging of components can occur rather fast and, due to the large beam diameter, to a larger extent. Charging can deform or deflect the beam in the column. Accordingly, particularly for electron beams with large NA and/or beam current embodiments described herein can be beneficially applied.

Figure 7:
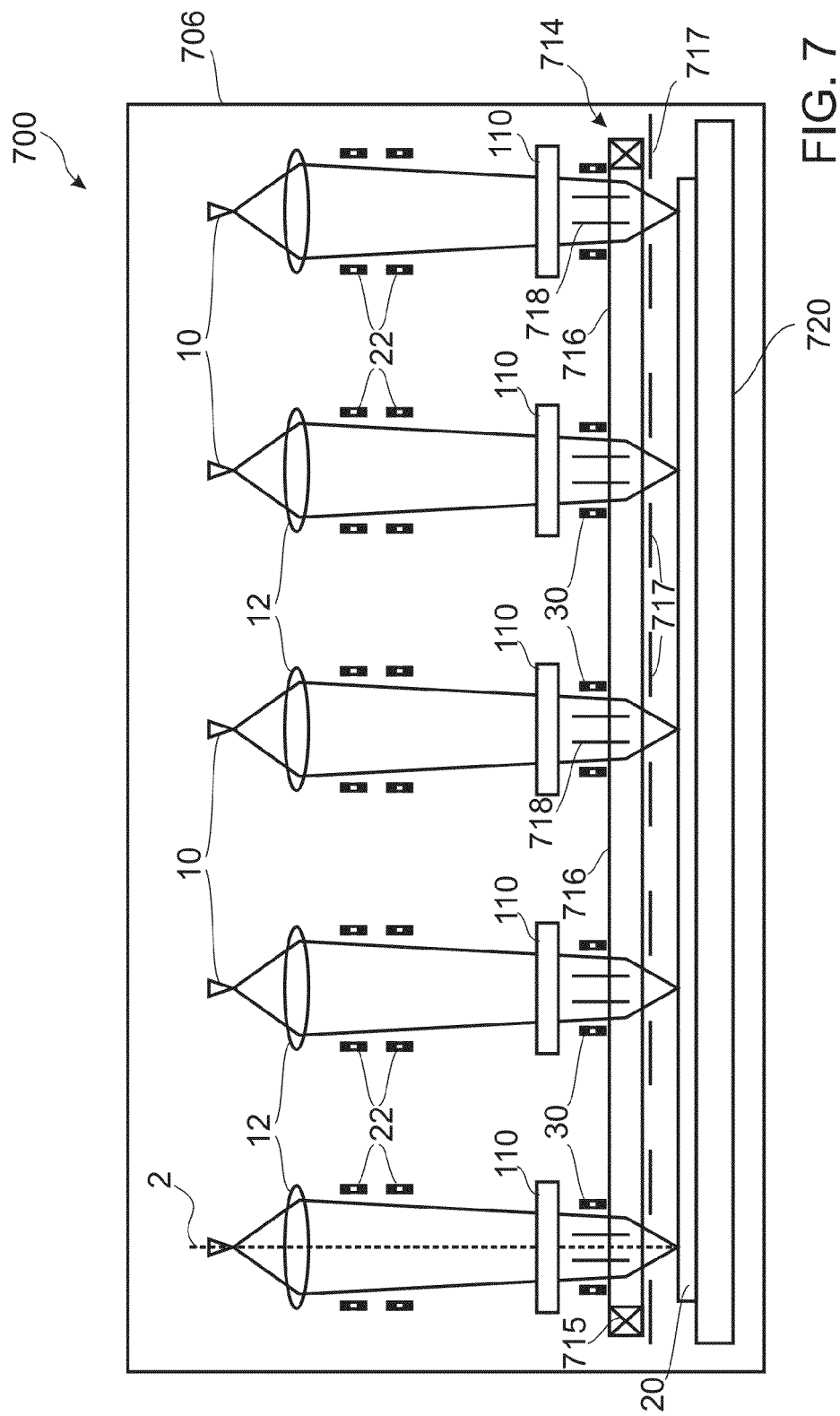
FIG. 7 shows schematically a multi-charged particle beam device with a compensation assembly adapted for compensating a four-fold astigmatism and having at least an eight-pole compensation capability according to embodiments described herein

FIG. 7 illustrates a device 700 with a plurality of charged particle beam emitters 10 for emitting a plurality of charged particle beams. The multi-charged particle beam device can be utilized as an electron beam inspection (EBI) device. Utilizing a plurality of charged particle beams is beneficial for EBI because inspection of entire wafers is critical with respect to wafer throughput. Measurement speed for full inspection is critical to avoid a bottle neck for semiconductor manufacturing and the like. Accordingly, it is beneficial to provide a multi-beam device with high beam currents, wherein the beam spot symmetry is compensated with a compensation assembly according to embodiments described herein. FIG. 7 shows the multi-charged particle beam device 700 having a vacuum chamber 706 to provide a beam column for the plurality of beams. There is a plurality of emitters 10 emitting the plurality of charged particle beams. For each beam a condenser lens 12, alignment deflectors 22, and scanning deflectors 30 are provided. The alignment deflectors 22 are exemplarily shown as double stage alignment deflection system in FIG. 7, and are shown in one direction. Yet alignment deflectors and scanning deflectors can also be provided in a second direction for alignment of the beam. A common objective lens 714 is provided for all of the plurality of charged particle beams. According to embodiments described herein, a multi-charged particle beam device 700 can include an objective lens 714, having one excitation coil 715 for exciting a pole piece assembly. The pole piece assembly typically includes an upper pole piece and a lower pole piece. Thereby, the pole piece includes an opening for each beam, i.e. there is one opening per beam. Each beam travels though the respective opening past the upper pole piece and past the lower pole piece in this opening. According to yet further embodiments, the objective lens is typically a decelerating combined electrostatic magnetic lens. In FIG. 7 for each beam an upper electrode 718 and a lower electrode 717 forming an immersion lens are shown. The common objective lens focuses the plurality of beams on the specimen 20, which is provided on a specimen stage. According to yet further embodiments, characteristics, arrangements and other properties described with respect to the single beam columns above can similarly be applied to the multi beam device. Accordingly, compensation assemblies 110 as described herein are provided for each of the electron beams.

A transition from single-beam devices to multi-beam devices might have one exception. Since the device 700 shown in FIG. 7 has a common objective lens, the objective lens might not have a full rotational symmetry with respect to each beam. However, the basic optical parameters of each sub-lens (focal length, aberration coefficients Cs and Cc) are essentially the same as for an ideally rotational symmetric lens with the same mechanical dimensions of the field-forming pole pieces, and the above described omission of astigmatic images etc. still occurs. It is to be understood, that for the objective lens 714 shown in FIG. 714 the rotational symmetry of the focusing properties is maintained to as far as possible and as described in more detail below. Thereby, it should be considered that the properties of the lens is less influenced by an asymmetry of the outer areas of the lens or a pole piece and the rotational properties are still provided for the openings to which the magnetic field is guided for acting on the beams passing through the opening. Typically, the deviation from a fully rotational symmetric round lens, e.g. for a single beam, occurs only for higher order deviations, for example 3rd order deviations, and e.g. as a fourfold astigmatism, which can be compensated for with the compensation assembly according to embodiments described herein.

According to some embodiments, which can be combined with other embodiments described herein, an optical system for a charged particle column includes an objective lens with an electrostatic lens component and a magnetic lens component. Each component comprises at least two sub-lenses, whereby by each sub-lens a charged particle beams is focused. According to yet further embodiments, which can be combined with other embodiments described herein, an optical system for a plurality of charged particle beams is provided. The charged particle optical system comprises at least two separate magnetic lens field areas and at least two separate electrostatic lens field areas in an objective lens 714. Thereby, the at least two separate magnetic lens field areas are driven by a common excitation coil 715. At least two charged particle beams travel through the optical system, each through a separate opening in the optical system. The at least two charged particle beams traveling through the at least two openings are focused or imaged each within one of the at least two magnetic lens field areas and within one of the at least two electrostatic lens field areas. Thereby, an opening in the optical system is to be understood as respective openings or holes in the components of the optical system. These holes in the components are located such with respect to each other, that a charged particle beam can travel through these holes. Thereby, the hole in the components are not meant to be strictly within on line, since the direction of a charged particle beam can corrected for e.g. by using deflection means.

As shown in FIG. 7, a charged particle beam device 700 can have a magnetic lens component. This magnetic lens component comprises an excitation coil 715. The diameter of this coil can be about 100 mm to 1000 mm. Thereby, the coil diameter depends in general on the number of electron beams focused by the objective lens 714. Further, there can be an upper pole piece and a lower pole piece. These pole pieces are preferably made of a magnetic conductive material, like perm alloy or μ-metal. In addition to the magnetic lens component there is an electrostatic lens component provided by elements 717 and 718. The lens system can be described as a plurality of sub-lenses for each of the electron beams. For the embodiments described with respect to FIG. 7, each of the electrostatic immersion sub-lenses of the electrostatic lens component comprises an upper electrode 718 and a lower electrode 717. These electrodes should be made of a non-magnetic conductive material.

Typically, the electrodes 718 and 717 are controlled to decelerate the electron beam for impingement on the specimen 20 with a desired landing energy. The deceleration of the primary electron beam in, e.g. an objective lens has two different effects. First, the electrons impinge on a specimen with reduced energy. Second, the electrons travel through the optical system with higher beam energy. Due to a retarding field, the electron energy of an electron impinging on a specimen can be reduced. This is especially relevant for imaging and inspection purposes. A specimen to be imaged, e.g. an integrated circuit, is preferably not charged by the electron beam. Therefore, however, the beam energy has to be reduced to obtain a balance between emitted secondary electrons and accepted primary electrons. Further, the higher beam energy above and partly within the optical system can be advantageous. Aberrations and influences of the so-called Boersch effect are reduced by higher beam energies. For example, chromatic aberrations depend on $\Delta E/E$. Thereby, $\Delta E$ is the energy spread of an electron beam. This energy spread or energy variation might be introduced by an electron gun or by a variation of acceleration voltages. To minimize the term $\Delta E/E$, the mean electron beam energy E can be increased. Thereby, chromatic aberrations are decreased. Thus, a high beam energy above one to several keV before and during the focusing is advantageous.

According to yet further embodiments, which can be combined with other embodiments described herein, the common objective lens 714 can also be provided by a "sliced objective lens". Examples of such a lens structure are described in EP 1 432 007 B1, which issued Mar. 10, 2010, which is incorporated herein by reference to the extent the applications are not inconsistent with this disclosure. Thereby, a lens system, i.e. an objective lens for a charged particle column is provided. The lens system includes at least two lens modules. The at least two lens modules share a single common excitation coil. Each lens module comprises a first and second pole piece and an opening for a charged particle beam. The lens modules can be separately manufactured and are provided next to each other to form the objective lens. Providing separate pole piece modules provides easier manufacturing of a common objective lens for a plurality of beams. Making use of the at least two lens modules with a common excitation coil, the size of the work pieces of the magnetic-conductive material can be reduced. Thus, the required size of raw material, which is difficult to obtain in large pieces, is reduced. Further, demands on manufacturing tolerances can more easily be realized with smaller work pieces attained from the raw material. Additionally, the lens properties of the individual lenses are more uniform with respect to each other. According to some embodiments, which can be combined with other embodiments described herein, an objective lens for a plurality of charged particle beams is provided. The objective lens comprises at least two individual lens modules, as e.g. described in EP 1 432 007 B1. Each lens module includes a first pole piece, a second pole piece and at least one opening for a charged particle beam. Further the objective lens includes at least one single common excitation coil providing a magnetic flux to the at least two lens modules.

Accordingly, the condenser lens assembly and the objective lens, which are described as rotationally symmetric with respect to FIG. 1 might have a four-fold symmetry in the event a multi-beam lens with individual modules is provided. However, this does still provide for a maximum rotational symmetry in the given system and is contrary to astigmatic images, which are an intended loss of rotational symmetry for aberration correction systems.

Methods for compensating and charged particle beam devices with compensation assemblies according to embodiments described herein, provide compensations other than correction of spherical and chromatic aberrations. For aberration correction, predetermined corrective contributions to the coefficients Cs and Cc are generated to compensate these coefficients. For the compensation of inaccuracies according to embodiments described herein, deviations from rotational properties are compensated for. Such inaccuracies can be mechanical manufacturing imperfections, misalignment of optical components, material inhomogenities, imperfections of the electric and magnetic fields used for focusing, aligning and adjusting, contaminations and charging of beam steering components, etc. These inaccuracies result in loss of perfect rotational symmetry. Compensation assemblies described herein are adapted to correct for such higher order inaccuracies. This is particularly useful for high beam current systems, systems with large numerical aperture, and/or multi-beam devices, e.g. for EBI applications, where aberration correction is not desired or appropriate, yet—as described above—compensation of these inaccuracies improve performance.

While the foregoing is directed to embodiments of the invention, other and further embodiments of the invention may be devised without departing from the basic scope thereof, and the scope thereof is determined by the claims that follow.

The invention claimed is:

1. A method of compensating mechanical, magnetic or electrostatic inaccuracies in a scanning charged particle beam device, comprising:
an alignment procedure, comprising:
compensating 4-fold astigmatism with an element having at least 8-pole compensation capability;
wherein the aligning and compensating steps of the alignment procedure act on a charged particle beam with beam dimensions in two orthogonal directions each of at least 50 µm and coaxially aligned with at least the element having at least the 8-pole compensation capability.

2. The method according to claim 1, wherein the alignment procedure further comprises the following steps conducted in this order and before the compensating the 4-fold astigmatism:
aligning a charged particle beam to be scanned over a specimen to an optical axis;
compensating axial astigmatism with an element having at least 4-pole compensation capability; and
compensating 3-fold astigmatism with an element having at least 6-pole compensation capability.

3. The method according to claim 2, wherein the alignment procedure further comprises fine focusing of the charged particle beam on the specimen after aligning the charged particle beam and before compensating the axial astigmatism.

4. The method according to claim 1, wherein the alignment procedure or a portion of the alignment procedure is iteratively conducted two or more times, such that two or more of the steps in the alignment procedure are iteratively conducted.

5. The method according to claim 1, wherein the 8-pole compensation capability is provided by an octopole field, which is adjustable in azimuth angle and strength.

6. The method according to claim 1, wherein the alignment procedure does not comprise a correction of spherical aberration and/or chromatic aberration and a decrease of aberration coefficients Cs and/or Cc.

7. The method according claim 1, the method further comprising:
adjusting the numerical aperture of the system to a value optimized for a system operated without the alignment procedure.

8. The method according to claim 1, the method further comprising:
adjusting the numerical aperture of the system to a value of 10 to 70 mrad.

9. The method according to claim 1, wherein the scanning charged particle beam device has a beam path without an astigmatic intermediate image.

10. The method according to claim 1, wherein the scanning charged particle beam device has a beam path without a cross-over between an objective lens and a condenser lens of a condenser lens assembly, wherein the condenser lens is the condenser lens of the condenser lens assembly closest to the objective lens.

11. A scanning charged particle beam device, comprising:
an emitter with at least one emitter tip configured for emitting a charged particle beam;
one lens assembly configured for focusing the emitter tip on a specimen, the focusing assembly consists of a condenser lens assembly and an objective lens, wherein the condenser lens assembly and the objective lens are rotationally symmetric;
a compensation assembly for compensating mechanical, magnetic or electrostatic inaccuracies, wherein the compensation assembly comprises at least one element selected from the group consisting of: a first octopole element and a second octopole element acting in respective different directions, a rotatable octopole element; and an element being at least a 12-pole element.

12. The device according to claim 11, further comprising:
a scanning deflector for scanning the charged particle beam over a specimen.

13. The device according to claim 11, wherein the alignment assembly further comprises:
a two-dimensional alignment deflector unit;
a two-dimensional stigmator; and
a two-dimensional hexapole element for compensating a three-fold astigmatism.

14. The device according to claim 11, wherein the numerical aperture of the system is 10 to 70 mrad.

15. The device according to claim 11, wherein the scanning charged particle beam device does not include lenses for generation of astigmatic images.

* * * * *

UNITED STATES PATENT AND TRADEMARK OFFICE
CERTIFICATE OF CORRECTION

| | | |
|---|---|---|
| PATENT NO. | : 8,816,270 B2 | Page 1 of 1 |
| APPLICATION NO. | : 13/663692 | |
| DATED | : August 26, 2014 | |
| INVENTOR(S) | : Kramer et al. | |

It is certified that error appears in the above-identified patent and that said Letters Patent is hereby corrected as shown below:

Title Page, (71) Applicants:

Please delete "Aleksandra Kramer, Munich (DE); Stefan Lanio, Erding (DE)" and insert -- ICT Integrated Circuit Testing Gesellschaft für Halbleiterprüftechnik mbH, Heimstetten (DE) -- therefor.

Signed and Sealed this
Thirteenth Day of January, 2015

Michelle K. Lee
*Deputy Director of the United States Patent and Trademark Office*